United States Patent
Tajima et al.

(10) Patent No.: US 9,240,779 B2
(45) Date of Patent: Jan. 19, 2016

(54) GATE DRIVING CIRCUIT

(71) Applicant: SANKEN ELECTRIC CO., LTD., Niiza-shi, Saitama (JP)

(72) Inventors: Kazunao Tajima, Niiza (JP); Hideki Asuke, Niiza (JP)

(73) Assignee: SANKEN ELECTRIC CO., LTD., Niiza-Shi (JP)

(*) Notice: Subject to any disclaimer, the term of this patent is extended or adjusted under 35 U.S.C. 154(b) by 0 days.

(21) Appl. No.: 14/125,008

(22) PCT Filed: Sep. 25, 2012

(86) PCT No.: PCT/JP2012/074481
§ 371 (c)(1),
(2) Date: Dec. 9, 2013

(87) PCT Pub. No.: WO2013/047476
PCT Pub. Date: Apr. 4, 2013

(65) Prior Publication Data
US 2014/0125386 A1 May 8, 2014

(30) Foreign Application Priority Data

Sep. 28, 2011 (JP) ................................. 2011-212190

(51) Int. Cl.
*H03K 17/00* (2006.01)
*H03K 17/16* (2006.01)
(Continued)

(52) U.S. Cl.
CPC ................ *H03K 17/16* (2013.01); *H01F 19/08* (2013.01);
(Continued)

(58) Field of Classification Search
CPC ....... H01F 27/34; H01F 27/36; H01F 27/362; H01F 27/365

USPC ......... 327/109, 108, 110, 111, 112, 379, 382, 327/389, 427, 434, 565, 596; 323/332, 338, 323/355, 356

See application file for complete search history.

(56) References Cited

U.S. PATENT DOCUMENTS

| | | | |
|---|---|---|---|
| 6,023,214 A * | 2/2000 | Ohta et al. | 336/84 R |
| 6,963,262 B2 * | 11/2005 | Mayfield | 336/84 R |
| 4,089,049 A | 5/1978 | Suzuki et al. | |
| 5,990,776 A | 11/1999 | Jitaru | |

(Continued)

FOREIGN PATENT DOCUMENTS

| | | |
|---|---|---|
| CN | 101640527 A | 2/2010 |
| JP | 52-26421 | 2/1977 |
| JP | 7-45451 A | 2/1995 |
| JP | 7-226664 A | 8/1995 |
| JP | 11-265831 | 9/1999 |

(Continued)

*Primary Examiner* — Jung Kim
(74) *Attorney, Agent, or Firm* — Birch, Stewart, Kolasch & Birch, LLP

(57) ABSTRACT

A gate driving circuit is provided which is capable of alleviating the effect of a switching noise generated when an IGBT is turned on/off or a common mode noise on a gate driving signal. The gate driving circuit, a primary side and a secondary side thereof being insulated from each other by a pulse transformer; the primary side of the pulse transformer being grounded to a first ground potential point; the secondary side of the pulse transformer being grounded to a second ground potential point insulated from the first ground potential point; and a gate driving signal generated in a secondary winding of the pulse transformer being outputted through a receiver having impedance matching resistors on the input side, includes an electrostatic shield plate between a primary winding of the pulse transformer and the secondary winding, the electrostatic shield plate being grounded to the second ground potential point.

6 Claims, 10 Drawing Sheets

(51) Int. Cl.
  *H02M 1/08* (2006.01)
  *H03K 17/691* (2006.01)
  *H01F 19/08* (2006.01)
  *H01F 27/36* (2006.01)
  *H02M 1/14* (2006.01)
  *H02M 3/335* (2006.01)

(52) U.S. Cl.
  CPC ............ *H01F 27/362* (2013.01); *H02M 1/08* (2013.01); *H02M 1/14* (2013.01); *H02M 3/33507* (2013.01); *H03K 17/163* (2013.01); *H03K 17/168* (2013.01); *H03K 17/691* (2013.01); *H01F 2019/085* (2013.01)

(56) References Cited

U.S. PATENT DOCUMENTS

| | | |
|---|---|---|
| 2007/0057755 A1 | 3/2007 | Suzuki et al. |
| 2007/0218595 A1 | 9/2007 | Yoshimura |
| 2008/0030080 A1 | 2/2008 | Chen et al. |
| 2009/0230938 A1 | 9/2009 | Sakurai |
| 2010/0289610 A1 | 11/2010 | Jacobson et al. |

FOREIGN PATENT DOCUMENTS

| | | |
|---|---|---|
| JP | 2003-244935 A | 8/2003 |
| JP | 2009-219294 A | 9/2009 |
| JP | 2010-263671 A | 11/2010 |

\* cited by examiner

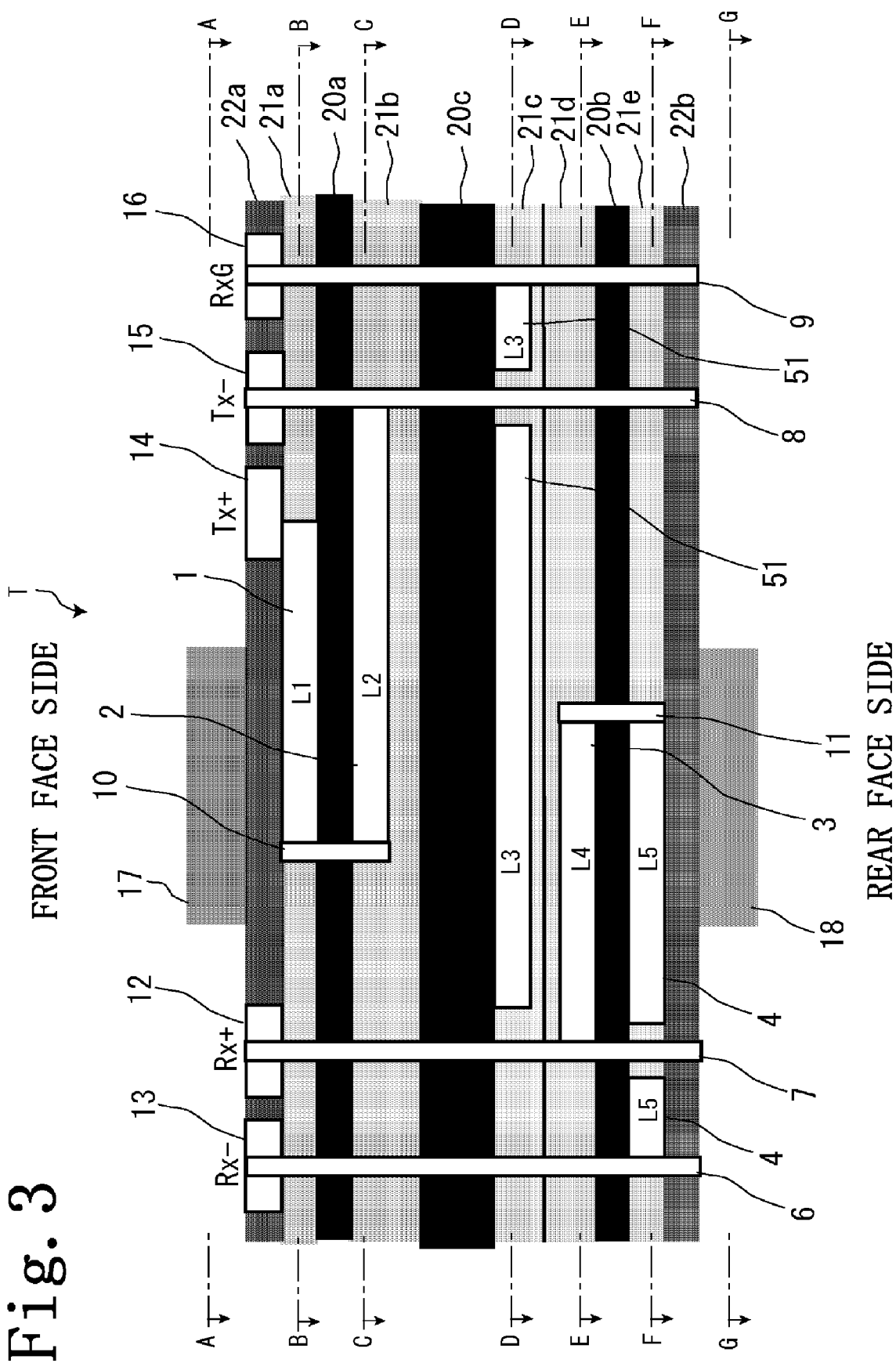

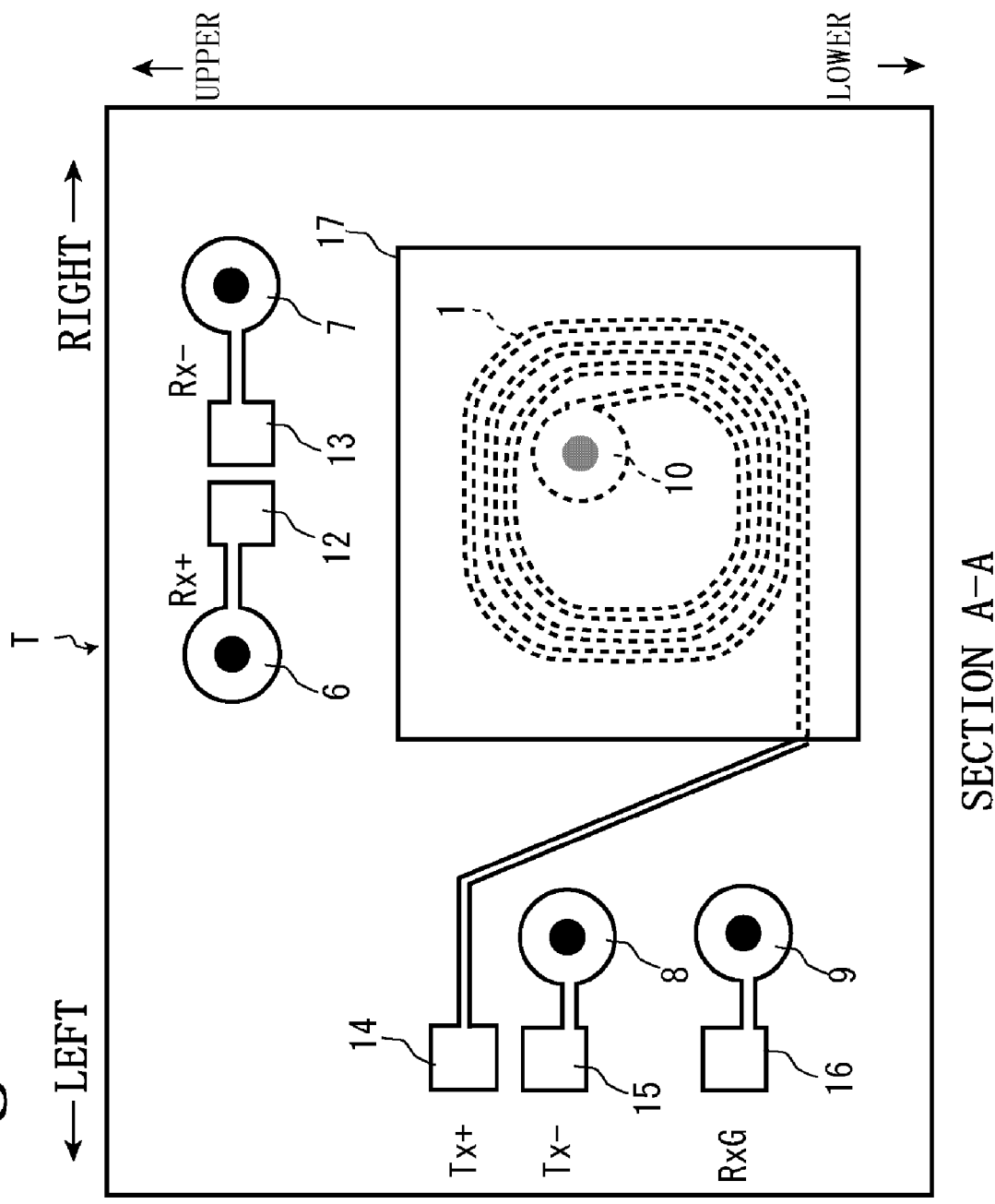

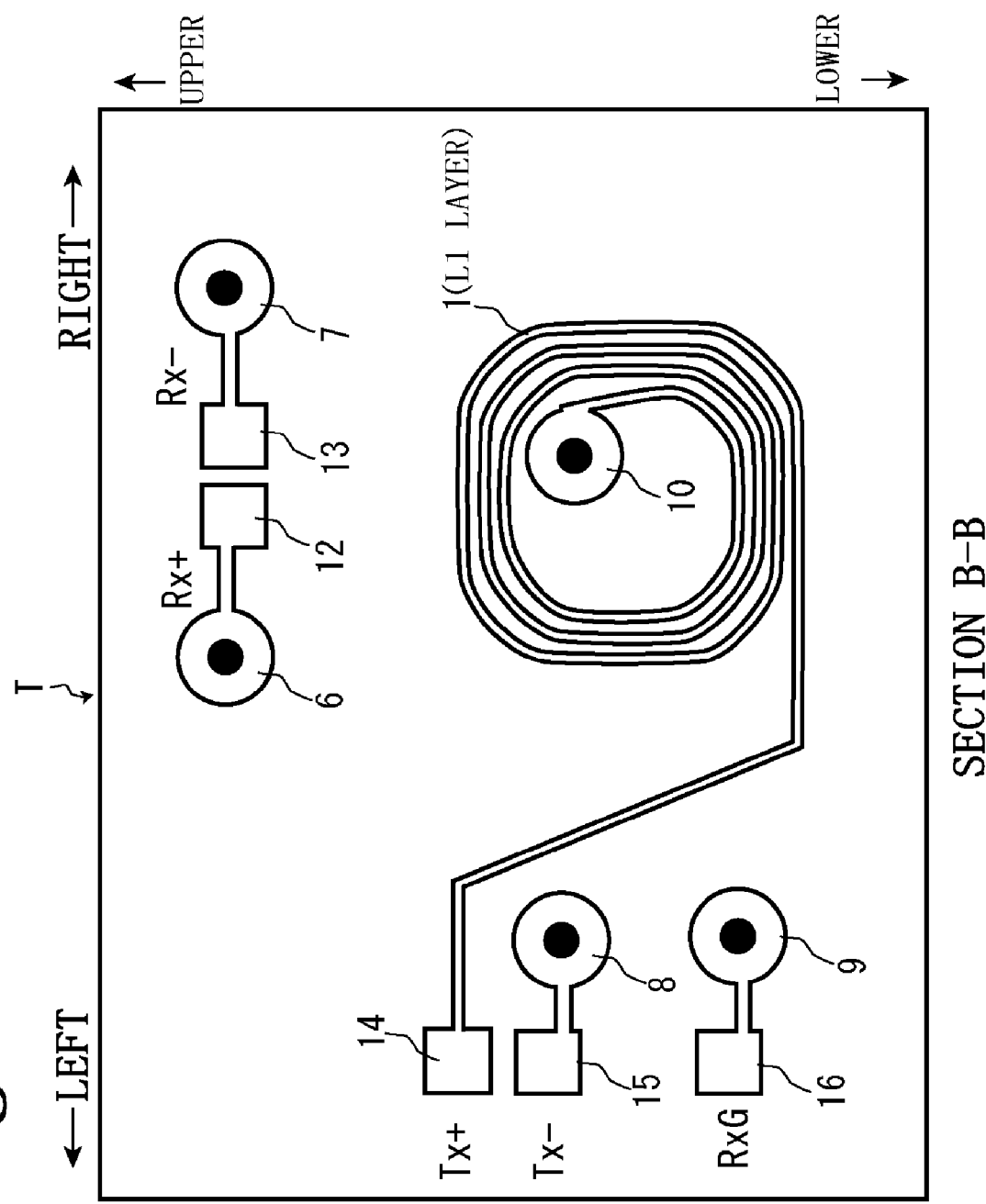

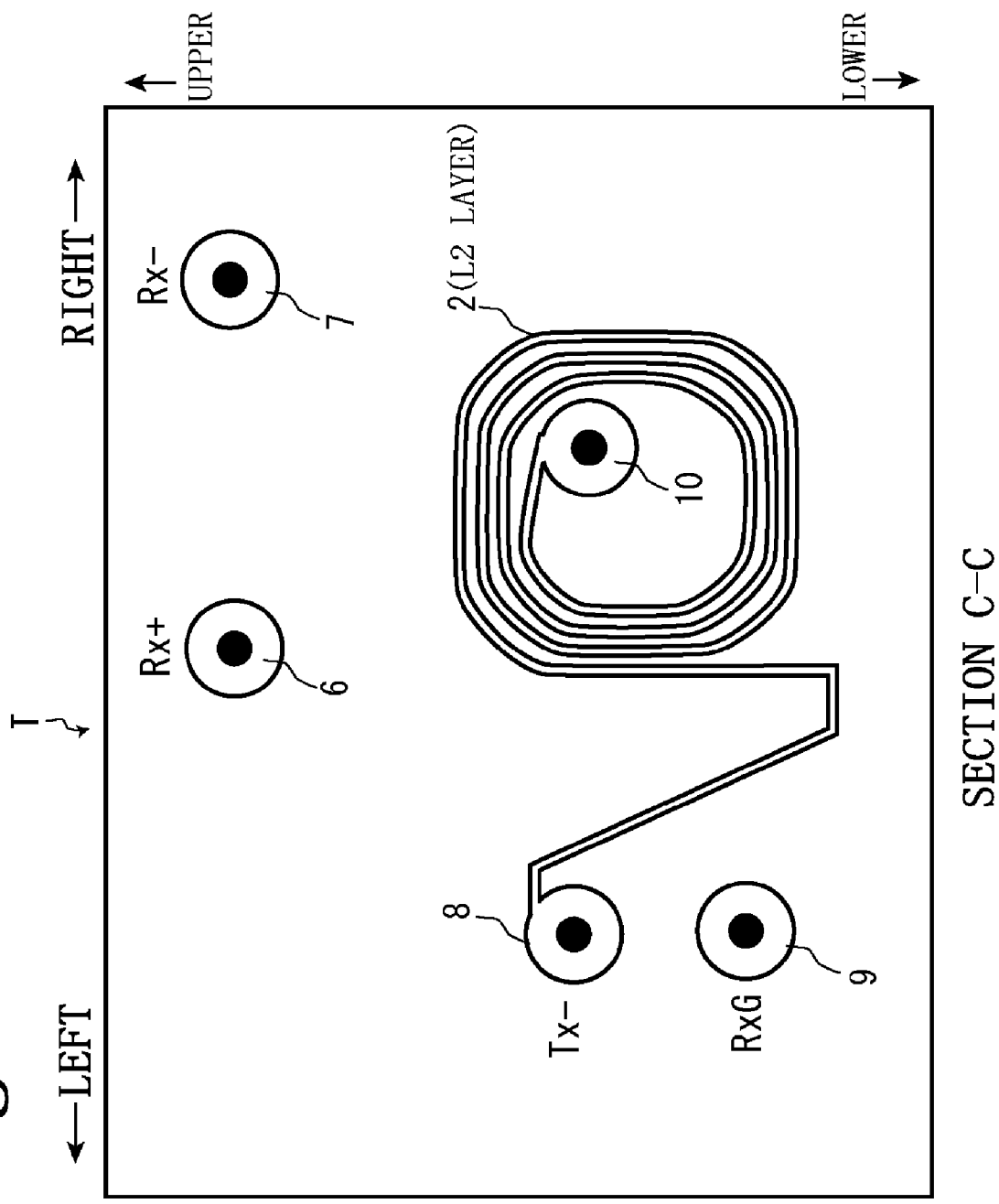

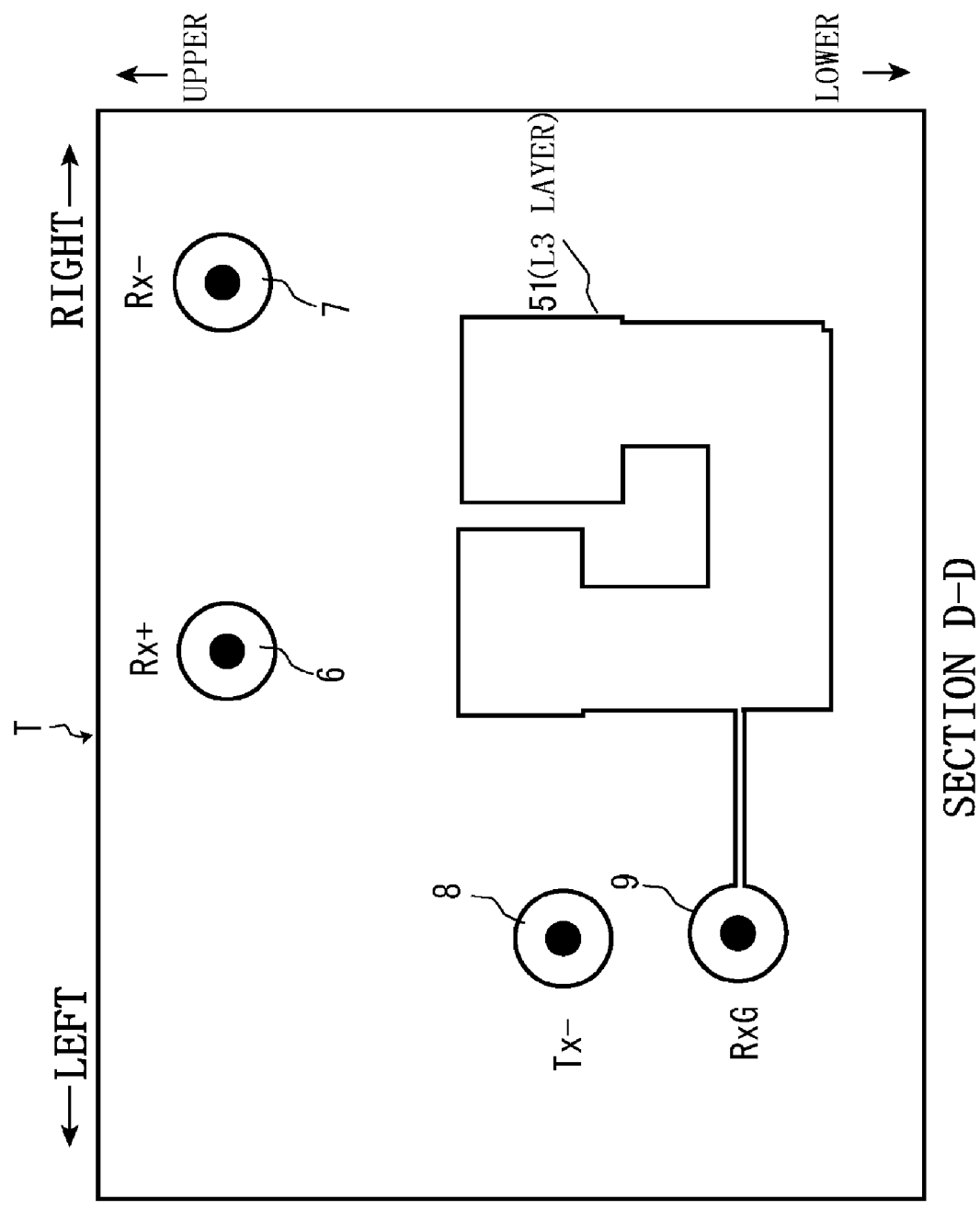

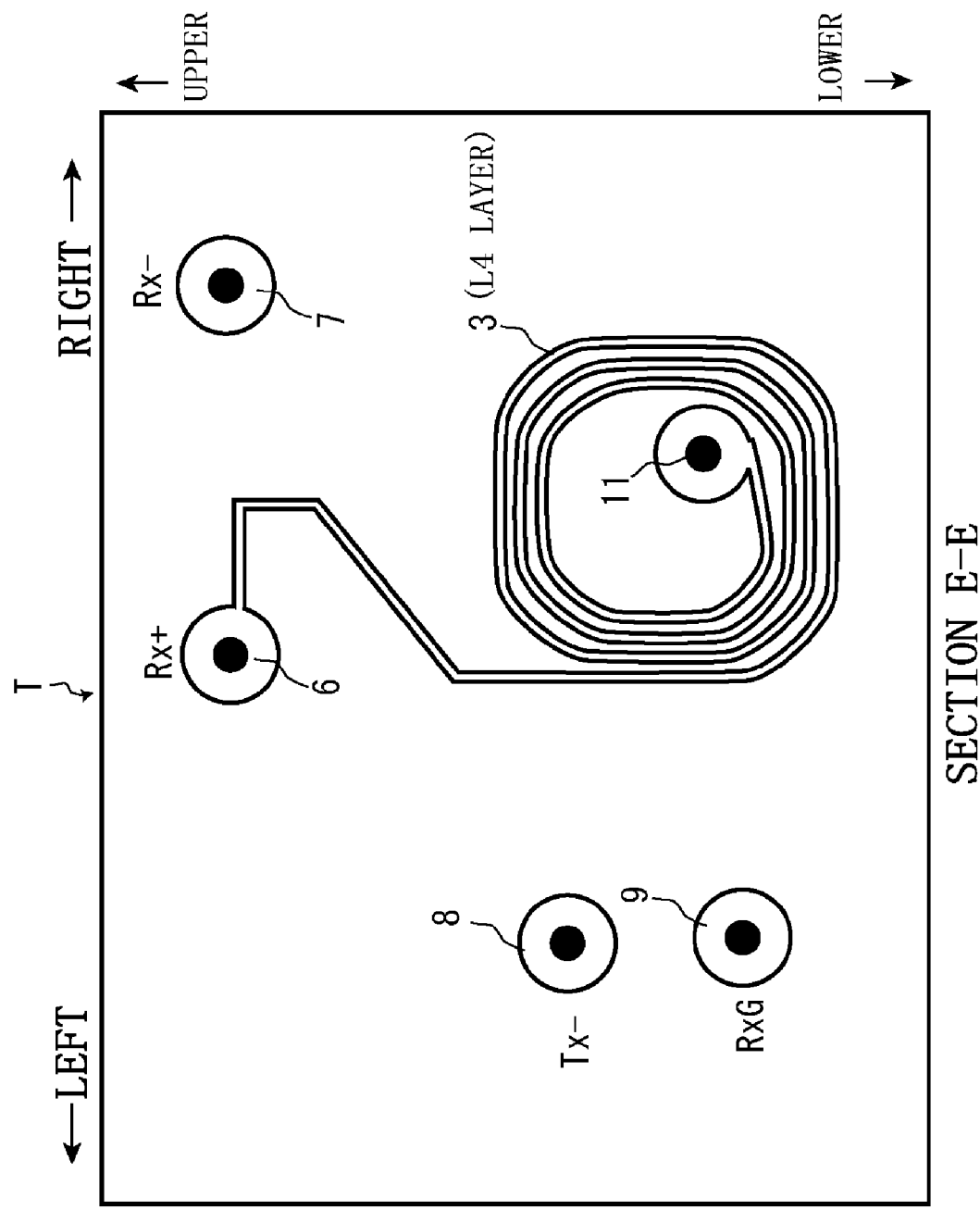

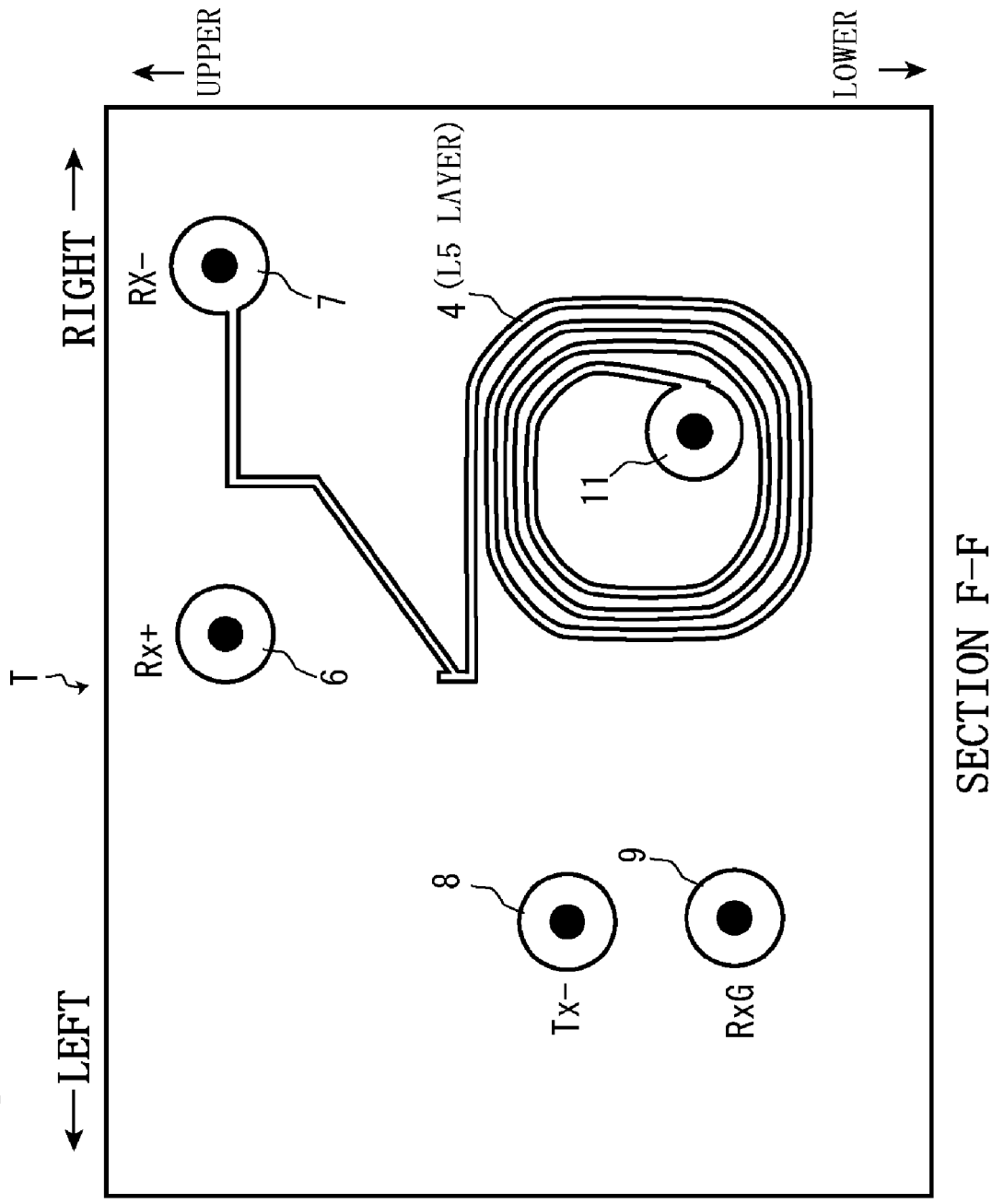

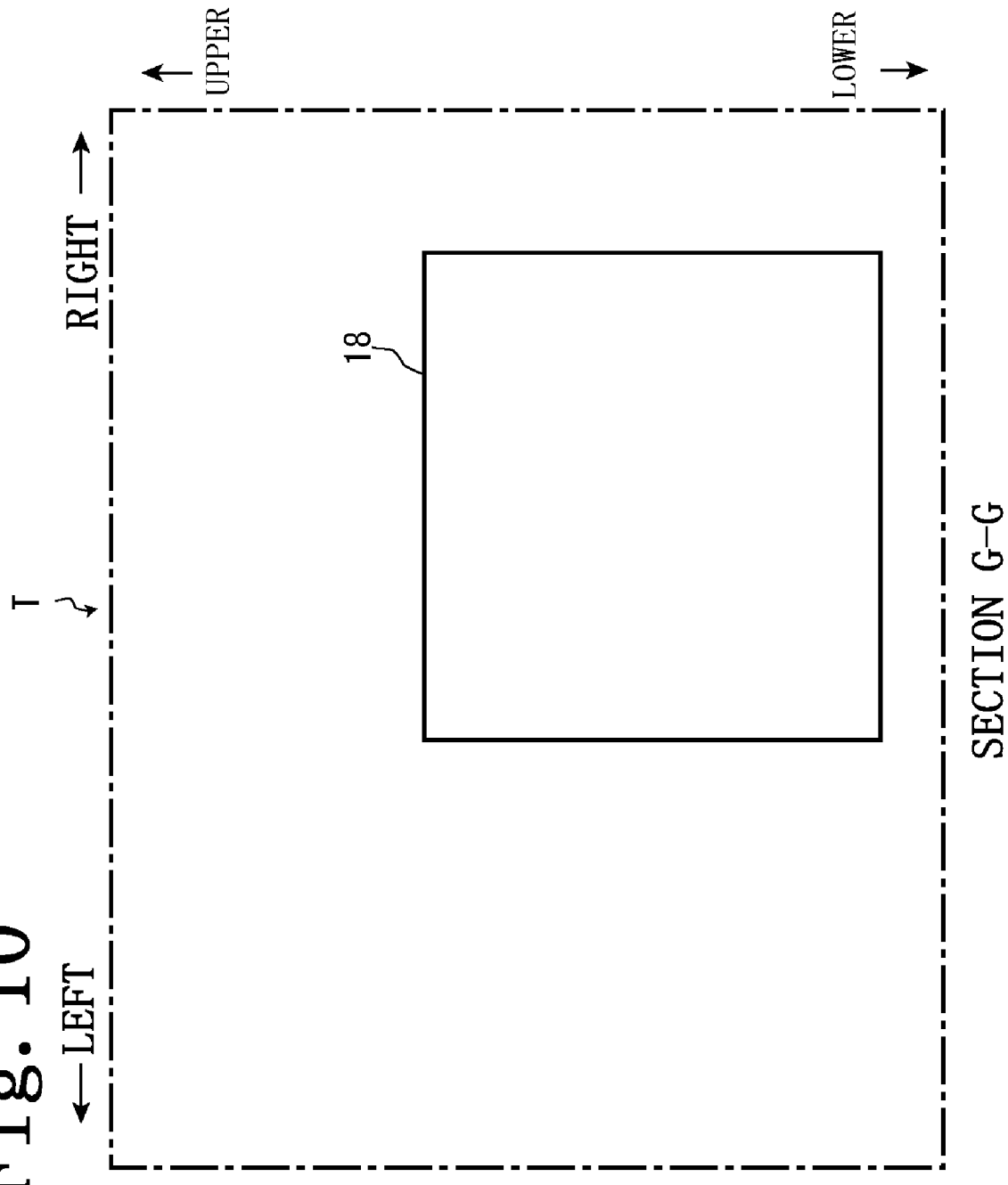

GATE DRIVING CIRCUIT

TECHNICAL FIELD

The present invention relates to a gate driving circuit for a semiconductor switching element, and particularly relates to reduction of a noise in a gate driving circuit using a pulse transformer of a sheet transformer structure for insulation between input and output sides.

BACKGROUND ART

Up to now, a power conversion apparatus is known which on-off controls a semiconductor switching element, such as an IGBT, for supplying power to a load, such as a motor. As such a conventional technology, a technology which is disclosed in Japanese Unexamined Patent Application Publication No. 2009-219294 is available.

The gate driving circuit of a power conversion apparatus based on this conventional technology transmits a gate driving signal from a microcomputer through two pulse transformers provided inside of an IC chip, including: a low side circuit which outputs a gate driving signal transmitted by one pulse transformer to a low side IGBT; a high breakdown voltage nMOS which performs potential conversion of a gate driving signal for a high side IGBT that has been transmitted through the other pulse transformer; and a high side circuit which outputs the gate driving signal having been subjected to potential conversion by the high breakdown voltage nMOS to the high side IGBT. And, on the basis of the driving signal (gate driving signal) outputted from the microcomputer, a current is supplied to the primary winding of the pulse transformer to thereby generate a voltage in the secondary winding, which is compared with the reference voltage to take out a signal.

Generally, the gate driving signal transmitted has a pulse width of approx. 1 ns to 2 ns, in other words, belongs to a frequency band of 1 GHz or so, thereby a transmission circuit including a receiver CMP capable of high speed transmission as shown in FIG. 1 is used.

In FIG. 1, when a gate driving signal for the primary side is inputted from a microcomputer to a primary winding N1 of a pulse transformer T through a driver DRV, this gate driving signal is transmitted to a secondary winding N2 of the pulse transformer T to be received by a differential receiver CMP. And, from an output terminal of the receiver CMP, a signal is outputted to the gate of an IGBT on the high side or low side as a gate driving signal on the secondary side. The two gate driving signals for the high side and the low side are transmitted through the respective two pulse transformers, however, FIG. 1 shows only one of them.

Thus, the IGBT is operated with a gate driving signal belonging to a frequency band of 1 GHz or so, and especially the low side IGBT is operated in a floating state with respect to the ground potential of a main power supply (herein, the main power supply refers to a power supply for supplying power to a load). Then, the receiver CMP for receiving a gate driving signal transmitted through the pulse transformer T is defined to be a current driven differential type one the characteristic impedance of which is matched, thereby providing a circuit configuration which is capable of high speed transmission.

The gate driving signal for an IGBT is generally a pulse signal produced by a PWM method, and such pulse signal is required to be raised or lowered at high speed. To meet such requirement, the receiver CMP is operated without being saturated, thereby being adapted to be operated at high speed.

Resistors R1 to R4 shown in FIG. 1 play a role to set the voltages inputted to the input terminals of the receiver CMP at a level for always holding the operation of the receiver CMP in a non-saturated state.

The resistor R1 is connected between a non-inverted input terminal of the receiver CMP and a control power supply Vcc; the resistor R2 is connected between the non-inverted input terminal of the receiver CMP and a second ground potential point GND2; the resistor R3 is connected between an inverted input terminal of the receiver CMP and the control power supply Vcc; and the resistor R4 is connected between the inverted input terminal of the receiver CMP and the second ground potential point GND2. Further, the potential at the second ground potential point GND2 generally provides a potential of the emitter of the IGBT driven. Therefore, in the gate driving circuit for the high side IGBT, the second ground potential point GND2 is generally in a floating state with respect to the ground potential of the main power supply.

CITATION LIST

Patent Literature

Patent Document 1: Japanese Unexamined Patent Application Publication No. 1995-226664

DISCLOSURE OF THE INVENTION

Problem to be Solved by the Invention

The primary side and the secondary side of the above pulse transformer T are insulated from each other, and are grounded to the first ground potential point GND1 and the second ground potential point GND2, respectively, which are insulated from each other. Therefore, the secondary side of the pulse transformer T is in a floating state with respect to the primary side. Between the primary winding N1 and the secondary winding N2 of the pulse transformer T, there exists a parasitic capacitance Cx, and thus, if a noise source voltage VPulse is applied between the primary winding N1 and the secondary winding N2 of the pulse transformer T, a noise current ix resulting from this noise source voltage VPulse flows through the parasitic capacitance Cx. The noise current ix flows from the secondary winding N2 of the pulse transformer T to the second ground potential point GND2 through the resistor R4, and at this time, a noise is generated across the resistor R4. Therefore, in some cases, a switching noise generated when an IGBT is turned on/off or a common mode noise made it impossible to transmit a gate driving signal to the secondary side of the pulse transformer T.

In view of the above-mentioned problem, the present invention has been made, and it is an object of the present invention to solve the problem and provide a gate driving circuit which can alleviate the effect of a switching noise generated when an IGBT is turned on/off or a common mode noise on the gate driving signal.

Means for Solving the Problems

The gate driving circuit in accordance with the present invention provides a gate driving circuit, a primary side and a secondary side thereof being insulated from each other by a pulse transformer; the primary side of the pulse transformer being grounded to a first ground potential point; the secondary side of the pulse transformer being grounded to a second ground potential point insulated from the first ground potential point; and a gate driving signal generated in a secondary winding of the pulse transformer being outputted through a receiver having an impedance matching resistor on the input side, including:

an electrostatic shield plate between a primary winding of the pulse transformer and the secondary winding, the electrostatic shield plate being grounded to the second ground potential point.

Further, the pulse transformer in the gate driving circuit of the present invention may be of a sheet transformer structure.

Further, the electrostatic shield plate in the gate driving circuit of the present invention may be constituted by an electrostatic shield pattern which is pattern-wired on an insulating material, being pattern-wired on the insulating material substantially in the shape of the letter C.

Further, the sheet transformer structure in the gate driving circuit of the present invention may be a structure in which a first winding pattern, a second winding pattern, the electrostatic shield pattern, a third winding pattern, and a fourth winding pattern are disposed in sequence such that the respective positions are overlapped one upon another from the front face side to the rear face side, the first winding pattern and the second winding pattern being connected to each other with a through-hole, thereby the primary winding wound in a spiral shape in the same direction being configured, while the third winding pattern and the fourth winding pattern being connected to each other with a through-hole, thereby the secondary winding in a spiral shape wound in the same direction being configured, and the electrostatic shield pattern being disposed between the primary winding constituted by the first winding pattern and the second winding pattern and the secondary winding constituted by the third winding pattern and the fourth winding pattern.

The gate driving circuit of the present invention may be a gate driving circuit in which a magnetic material core is disposed on the front face and the rear face of the pulse transformer, respectively, in correspondence to the position of the pulse transformer in which the first winding pattern, the second winding pattern, the electrostatic shield pattern, the third winding pattern, and the fourth winding pattern are disposed.

Advantage of the Invention

In accordance with the present invention, the effect of a switching noise generated when an IGBT is turned on/off or a common mode noise on the gate driving signal can be alleviated.

BRIEF DESCRIPTION OF THE DRAWINGS

FIG. 3 is a diagram illustrating the configuration of a pulse transformer for use in the gate driving circuit in accordance with the present invention;

FIG. 4 is a sectional view of the pulse transformer taken along line A-A of FIG. 3;

FIG. 5 is a sectional view of the pulse transformer taken along line B-B of FIG. 3;

FIG. 6 is a sectional view of the pulse transformer taken along line C-C of FIG. 3;

FIG. 7 is a sectional view of the pulse transformer taken along line D-D of FIG. 3;

FIG. 8 is a sectional view of the pulse transformer taken along line E-E of FIG. 3;

FIG. 9 is a sectional view of the pulse transformer taken along line F-F of FIG. 3; and FIG. 10 is a sectional view of the pulse transformer taken along line G-G of FIG. 3.

BEST MODE FOR CARRYING OUT THE INVENTION

Next, an embodiment of the present invention will be specifically explained with reference to the drawings. In the gate driving circuit for a motor driving IGBT, the second ground potential point GND2 on the secondary side of the pulse transformer T is generally in a floating state with respect to the first ground potential point GND1 on the primary side of the pulse transformer T, and further, in the gate driving circuit for a high side IGBT, the second ground potential point GND2 is in a floating state with respect to the ground potential of the main power supply. Therefore, there was a problem that a gate driving signal is susceptible to a potential fluctuation at the second ground potential point GND2 due to the above-mentioned noise current ix. Generally, between the primary winding N1 and the secondary winding N2 of the pulse transformer T, there exists a parasitic capacitance Cx, and thus a noise current ix flows on any side of the primary side and the secondary side of the pulse transformer T. Especially when the noise current ix flows into between the differential signal reception terminals, the voltage for the differential amplifier (receiver CMP) fluctuates, resulting in a circuit malfunction. The present invention is configured to provide an electrostatic shield against the above-mentioned parasitic capacitance Cx so as to cause the noise current to flow into a separate path free from any circuit problem (directly from an electrostatic shield plate 5 to the second ground potential point GND2).

Figure 1:
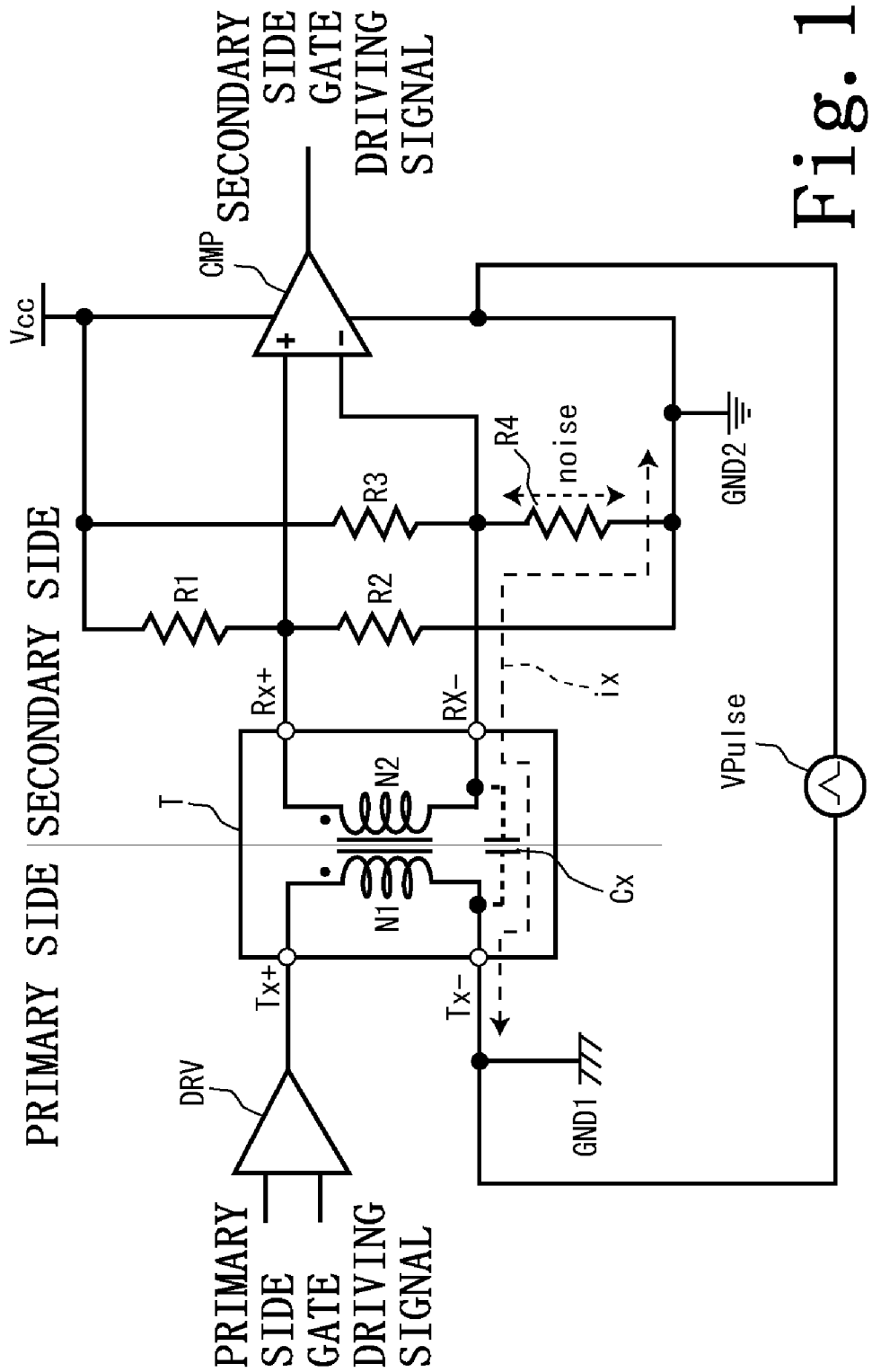
FIG. 1 is a diagram illustrating the configuration of a gate driving circuit according to a conventional technology.
Figure 2:
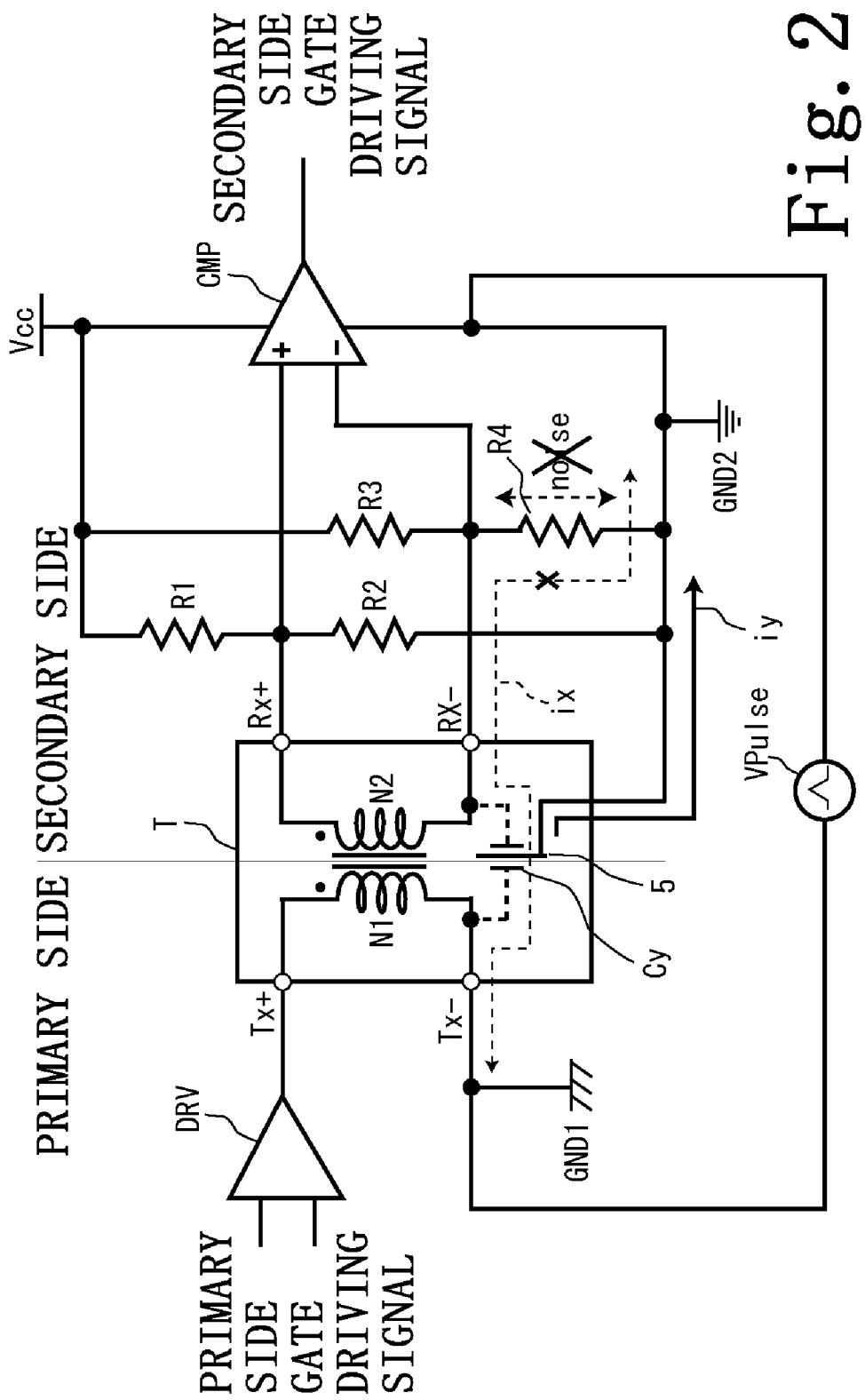
FIG. 2 is a diagram illustrating the configuration of a gate driving circuit in accordance with the present invention.

FIG. 2 is a diagram illustrating a simple circuit configuration of a switching element gate driving circuit in accordance with the present invention. The circuit in FIG. 2 is different from that shown in FIG. 1, which is a gate driving circuit according to the conventional technology, in that an electrostatic shield plate 5 is provided, and the electrostatic shield plate 5 is grounded to the second ground potential point GND2. The other reference characters which are the same as those in FIG. 1 denote the same components, respectively. The basic operations of the gate driving circuits shown in FIG. 1 and FIG. 2 are the same except for the electrostatic shielding effect provided by the electrostatic shield plate 5; therefore, hereinbelow the different operations will be explained, and the other ones will be simply explained as appropriate. In FIG. 2, the noise source of a switching noise or a common mode noise is represented as a noise source voltage VPulse.

As shown in FIG. 2, between the primary winding N1 and the secondary winding N2 of the pulse transformer T, the electrostatic shield plate 5 is provided, being directly grounded to the second ground potential point GND2. When the noise source voltage VPulse is applied between the primary side and the secondary side of the pulse transformer T, a noise current iy flows from the primary winding N1 to the secondary side through a parasitic capacitance Cy which is formed between the primary winding N1 and the electrostatic shield plate 5. This noise current iy flows directly into the second ground potential point GND2 so as to bypass the secondary winding N2 and the resistor 4. Therefore, with the gate driving circuit according to the conventional technology, the voltage for the receiver CMP was fluctuated by the noise current ix flowing through the resistor R4, however, according to the present embodiment, the noise current iy will not flow through the resistor R4, thereby the voltage applied to the receiver CMP will not be fluctuated by the noise current iy, resulting in the receiver CMP performing a stable operation, whereby the effect of a switching noise generated when an IGBT is turned on/off or a common mode noise on the gate driving signal can be alleviated.

FIG. 3 schematically shows the structure of the pulse transformer T, which has a sheet transformer structure. As shown in FIG. 3, in the pulse transformer T, a core material 20a on the front face of which a winding pattern 1 (an L1 layer formed of a copper film) is formed, while, on the rear face of which a winding pattern 2 (an L2 layer formed of a copper film) being formed, and a core material 20b on the front face of which a winding pattern 3 (an L4 layer formed of a copper film) is formed, while, on the rear face of which a winding pattern 4 (an L5 layer formed of a copper film) being formed, are disposed, being bonded to each other with prepregs 21a to 21e to form a sheet transformer. The front face and the rear face of the pulse transformer T, which is formed as a sheet transformer, are covered with a solder resist 22a, 22b for protection thereof, respectively. Further, on the rear face of a core material 20c disposed between the winding pattern 2 (L2 layer) and the winding pattern 3 (L4 layer), an electrostatic shield pattern 51 (an L3 layer formed of a copper film), which provides the electrostatic shield plate 5, is disposed. The core material 20c, on which the electrostatic shield pattern 51 (L3 layer) is disposed, is disposed between the winding pattern 2 (L2 layer) and the winding pattern 3 (L4 layer), being bonded with prepregs 21b to 21d. The winding pattern 1 (L1 layer) and the winding pattern 2 (L2 layer) are connected to each other through a through-hole 10 to form the primary winding N1, while the winding pattern 3 (L4 layer) and the winding pattern 4 (L5 layer) are connected to each other through a through-hole 11 to form the secondary winding N2. In this way, the electrostatic shield pattern 51 is disposed so as to cancel the parasitic capacitance Cx between the primary winding N1 and the secondary winding N2. The core materials 20a to 20c are formed of an insulating material (for example, a glass epoxy resin).

Next, the respective layers, L1 to L5, and a magnetic material core 17, 18 provided on the front face and the rear face of the pulse transformer T, respectively, will be explained with reference to FIG. 4 to FIG. 10. The disposition of the respective layers shown in FIG. 4 to FIG. 10 does not partly match the disposition of the components of the pulse transformer T shown in FIG. 3, however, this is because the components of the pulse transformer T shown in FIG. 3 are expressed in a schematic and simplified manner.

FIG. 4 shows a section of the pulse transformer taken along line A-A of FIG. 3. In FIG. 4, a portion where the whole is enclosed by a rectangle represents the pulse transformer T when viewed from the surface side thereof. As shown in FIG. 4, the magnetic material core 17 is disposed so as to cover the winding pattern 1 (L1 layer). As can be seen from the disposition of the components shown in the respective sectional views of FIG. 4 to FIG. 10, the magnetic material core 17, the winding pattern 1 (L1 layer), the winding pattern 2 (L2 layer), the winding pattern 3 (L4 layer), the winding pattern 4 (L5 layer), and the magnetic material core 18 are disposed so as to be overlapped one upon another such that a good magnetic coupling is provided between the primary winding N1 and the secondary winding N2 of the pulse transformer T, and the electrostatic shield pattern 51 (L3 layer) is disposed between the primary winding N1 and the secondary winding N2 so as to be overlapped one upon another such that the parasitic capacitance between the primary winding N1 and the secondary winding N2 is cancelled. Since the pulse transformer T is a sheet transformer having a size of approx. a few mm in length per side, it is structurally difficult to provide an iron core between the primary winding N1 and the secondary winding N2 as in the general transformer. Then, it is recommended that the magnetic material core 17 be disposed so as to be stuck to the front face of the pulse transformer T. By doing so, the magnetic resistance between the primary winding N1 and the secondary winding N2 of the pulse transformer T can be reduced. As the magnetic material core 17, an amorphous core, or the like, can be utilized.

FIG. 5 shows a section of the pulse transformer T taken along line B-B of FIG. 3. In FIG. 5, the winding pattern 1 (L1 layer) is pattern-wired in a spiral shape on the front face of the core material 20a (in an example given in FIG. 5, a winding in a counterclockwise spiral shape is formed from a pad 14 toward the through-hole 10). In the area on the left side of the winding pattern 1 (L1 layer), a signal input terminal on the positive side, Tx+, a signal input terminal on the negative side, Tx−, and a grounding terminal RxG of the electrostatic shield pattern 51 (L3 layer) are disposed, and in the area on the upper side of the magnetic material core 17, a signal output terminal on the positive side, Rx+, and a signal output terminal on the negative side, Rx−, are disposed. In a pad 12, a through-hole 6 for the signal output terminal Rx+ is pattern-wired, while, in a pad 13, a through-hole 7 for the signal output terminal Rx− is pattern-wired, and in a pad 15, a through-hole 8 for the signal input terminal Tx− is pattern-wired, while, in a pad 16, a through-hole 9 for the electrostatic shield grounding terminal RxG is pattern-wired. In addition, a pad 14 is connected to the winding pattern 1 by pattern wiring. The surface other than the areas of the pad 12 to the pad 16 is covered with the solder resist 22a for protection thereof from the external environment. The pad 12 to the pad 16 are gold-plated, being connected to an external component (not shown) with a gold wire, or the like (not shown). Although it is not shown in FIG. 4, the winding pattern 1 (L1 layer) is connected to the winding pattern 2 (L2 layer) through the through-hole 10. The direction of winding of the winding pattern 1 (L1 layer) and that of the winding pattern 2 (L2 layer) are made identical when both winding patterns are connected to each other with the through-hole 10.

FIG. 6 shows a section of the pulse transformer T taken along line C-C of FIG. 3. In FIG. 6, the winding pattern 2 (L2 layer) is pattern-wired in a spiral shape on the rear face of the core material 20a (in an example given in FIG. 6, a winding in a counterclockwise spiral shape is formed from the through-hole 10 toward the through-hole 8). In the area on the left side of the winding pattern 2 (L2 layer), the through-hole 8 for the signal input terminal Tx− and the through-hole 9 for the electrostatic grounding terminal RxG are disposed, and in the area on the upper side of the winding pattern 2 (L2 layer), the through-hole 6 for the signal output terminal Rx+ and the through-hole 7 for the signal output terminal Rx− are disposed. The through-hole 8 for the signal input terminal Tx− is connected to one end of the winding pattern 2 (L2 layer) by pattern wiring, and the other end of the winding pattern 2 (L2 layer) is connected to the through-hole 10. Although it is not shown in FIG. 6, the winding pattern 2 (L2 layer) is connected to the winding pattern 1 (L1 layer) through the through-hole 10. The direction of winding of the winding pattern 1 (L1 layer) and that of the winding pattern 2 (L2 layer) are made identical when both winding patterns are connected to each other with the through-hole 10.

FIG. 7 shows a section of the pulse transformer T taken along line D-D of FIG. 3. In FIG. 7, the electrostatic shield pattern 51 (L3 layer) is pattern-wired substantially in the shape of the letter C on the rear face of the core material 20c. Like this, forming the pattern of the electrostatic shield pattern 51 (L3 layer) substantially in the shape of the letter C will provide a structure which suppresses generation of an eddy current due to a magnetic flux occurring in the pulse transformer T and a weak magnetic field due to the eddy current. In the area on the left side of the electrostatic shield pattern 51 (L3 layer), the through-hole 8 for the signal input terminal Tx− and the through-hole 9 for the electrostatic grounding terminal RxG are disposed, and in the area on the upper side of the electrostatic shield pattern 51 (L3 layer), the through-hole 6 for the signal output terminal Rx+ and the through-hole 7 for the signal output terminal Rx− are disposed. The through-hole 9 for the electrostatic grounding terminal RxG is connected to the electrostatic shield pattern 51 (L3 layer) by pattern wiring.

FIG. 8 shows a section of the pulse transformer T taken along line E-E of FIG. 3. In FIG. 8, the winding pattern 3 (L4 layer) is pattern-wired in a spiral shape on the front face of the core material 20b (in an example given in FIG. 8, a winding in a counterclockwise spiral shape is formed from the through-hole 6 toward the through-hole 11). In the area on the left side of the winding pattern 3 (L4 layer), the through-hole 8 for the signal input terminal Tx− and the through-hole 9 for the electrostatic grounding terminal RxG are disposed, and in the area on the upper side of the winding pattern 3 (L4 layer), the through-hole 6 for the signal output terminal Rx+ and the through-hole 7 for the signal output terminal Rx− are disposed. The through-hole 6 for the signal output terminal Rx+ is connected to one end of the winding pattern 3 (L4 layer) by pattern wiring, and the other end of the winding pattern 3 (L4 layer) is connected to the through-hole 11. Although it is not shown in FIG. 8, the winding pattern 3 (L4 layer) is connected to the winding pattern 4 (L5 layer) through the through-hole 11. The direction of winding of the winding pattern 3 (L4 layer) and that of the winding pattern 4 (L5 layer) are made identical when both winding patterns are connected to each other with the through-hole 11.

FIG. 9 shows a section of the pulse transformer T taken along line F-F of FIG. 3. In FIG. 9, the winding pattern 4 (L5 layer) is pattern-wired in a spiral shape on the rear face of the core material 20b (in an example given in FIG. 9, a winding in a counterclockwise spiral shape is formed from the through-hole 11 toward the through-hole 7). In the area on the left side of the winding pattern 4 (L5 layer), the through-hole 8 for the signal input terminal Tx− and the through-hole 9 for the electrostatic grounding terminal RxG are disposed, and in the area on the upper side of the winding pattern 4 (L5 layer), the through-hole 6 for the signal output terminal Rx+ and the through-hole 7 for the signal output terminal Rx− are disposed. The through-hole 7 for the signal output terminal Rx+ is connected to one end of the winding pattern 4 (L5 layer) by pattern wiring, and the other end of the winding pattern 4 (L5 layer) is connected to the through-hole 11. Although it is not shown in FIG. 9, the winding pattern 4 (L5 layer) is connected to the winding pattern 3 (L4 layer) through the through-hole 11. The direction of winding of the winding pattern 4 (L5 layer) and that of the winding pattern 3 (L4 layer) are made identical when both winding patterns are connected to each other with the through-hole 11.

FIG. 10 shows a section of the pulse transformer T taken along line G-G of FIG. 3. In FIG. 10, a portion where the whole is enclosed with a rectangle expressed with a dashed line represents the pulse transformer T, and the magnetic material core 18 is disposed so as to be overlapped upon the magnetic material core 17, the winding pattern 1 (L1 layer), the winding pattern 2 (L2 layer), the winding pattern 3 (L4 layer), and the winding pattern 4 (L5 layer) such that a good magnetic coupling is provided between the primary winding N1 and the secondary winding N2 of the pulse transformer T. In other words, the magnetic material core 18 is paired with the magnetic material core 17 to be inserted together into the magnetic circuit between the primary winding N1 and the secondary winding N2 of the pulse transformer T to thereby reduce the magnetic resistance. As described above, since the pulse transformer T is a sheet transformer having a size of approx. a few mm in length per side, it is structurally difficult to provide an iron core between the primary winding N1 and the secondary winding N2 as in the general transformer, the magnetic material core 18 is disposed so as to be stuck to the rear face in a place corresponding to the magnetic material core 17 in the same manner as with the magnetic material core 17. As the magnetic material core 18, an amorphous core, or the like, can be utilized as with the magnetic material core 17.

As specifically described in the above embodiment, according to the gate driving circuit in accordance with the present invention, a noise current is caused to bypass the secondary winding N2 and the impedance matching resistors, such as the resistor R4, and the like, for directly flowing into the second ground potential point GND2, whereby the effect of a switching noise generated when an IGBT is turned on/off or a common mode noise on the gate driving signal can be alleviated.

In addition, in the above explanation, the dispositional relationships about the vertical and horizontal directions, and the front and rear faces are based on the drawings for convenience of explanation, and are not defined as those in actual use. In addition, for the respective through-holes 6 to 9, and pads 12 to 16, the dispositional relationships have been defined, but those dispositional relationships may be altered as appropriate. In the structure shown in FIG. 3, provided that the mutual positional relationship among the winding pattern 1 (L1 layer), the winding pattern 2 (L2 layer), the winding pattern 3 (L4 layer), the winding pattern 4 (L5 layer), and the electrostatic shield pattern 51 (L3 layer) is not changed, the configuration of the respective layers 20a to 20c of the core material and the respective layers 21a to 21e of the prepreg may be altered. For example, in the above explanation, the electrostatic shield pattern 51 (L3 layer) is defined to be pattern-wired substantially in the shape of the letter C on the rear face of the core material 20c, however, by altering the configuration of the core material and the prepreg, the electrostatic shield pattern 51 (L3 layer) may be pattern-wired on the front face of the core material 20c. In addition, the noise current ix flowing through the resistor R4 has been noticed for explanation, however, in accordance with the present invention, the effect of the noise current flowing through the resistors R1 to R3 can also be alleviated in the same manner. In addition, the winding patterns of the L1 layer, L2 layer, L4 layer, and L5 layer have been explained as a winding in a counterclockwise spiral shape, however, the winding patterns of the same may, of course, be a clockwise spiral. Further, the embodiment which has been explained under the title of "Best Mode for Carrying Out the Invention" is merely an example, and may, of course, be altered within the scope of the spirit of the present invention.

DESCRIPTION OF SYMBOLS

The reference symbol 1 denotes a winding pattern (L1 layer); 2 a winding pattern (L2 layer); 3 a winding pattern (L4 layer); 4 a winding pattern (L5 layer); 5 an electrostatic shield plate; 6 to 11 a through-hole, respectively; 12 to 16 a pad, respectively; 17, 18 a magnetic material core; 20a to 20c a core material, respectively; 21a to 21e a prepreg, respectively; 22a, 22b a solder resist, respectively; 51 an electrostatic shield pattern (L3 layer); R1 to R4 a resistor, respectively; Cx a parasitic capacitance (without an electrostatic shield plate) between primary winding N1 and secondary winding N2 of pulse transformer T; Cy a parasitic capacitance between primary winding N1 and electrostatic shield plate 5 of pulse transformer T; DRV a driver; CMP a receiver; T a pulse transformer; N1 a primary winding of pulse transformer T; N2 a secondary winding of pulse transformer T; GND1 a first ground potential point; GND2 a second ground potential point; Vcc a control power supply; VPulse a noise source voltage; Tx+ a signal input terminal on the positive side; Tx− a signal input terminal on the negative side; Rx+ a signal output terminal on the positive side; Rx− a signal output terminal on the negative side; RxG an electrostatic shield grounding terminal; and ix, iy a noise current.

The invention claimed is:

1. A gate drive circuit, comprising:
   a driver that outputs a gate driving signal of a primary side;
   a pulse transformer that transmits the gate driving signal, which is output from the driver, from a primary winding to a secondary winding and has:
      a first layer including:
         the primary winding connected to an output of the driver and to a first ground potential point,
         a signal input terminal of positive side connected to an end of the primary winding,
         a signal input terminal of negative side connected to another end of the primary winding,
         a ground terminal,
         a signal output terminal of positive side, and
         a signal output terminal of negative side,
      a second layer including:
         the secondary winding connected to a second ground potential point insulated from the first ground potential point,
         a first connecting part connected to an end of the secondary winding and to the signal output terminal of positive side, and
         a second connecting part connected to another end of the secondary winding and to the signal output terminal of negative side, and
      a third layer being provided via an insulating layer between the first layer and the second layer and including:
         a static shield connected to the second ground potential point, and
         a third connecting part connected to the static shield and to the ground terminal; and
   a receiver that receives the gate driving signal transmitted to the secondary winding.

2. The gate drive circuit according to claim 1, wherein the shield is connected directly to the second ground potential point via the ground terminal.

3. The gate drive circuit according to claim 1, wherein the third layer further includes
   a fourth connecting part connected to the signal output terminal of positive side and to the first connecting part, and
   a fifth connecting part connected to the signal output terminal of negative side and to the second connecting part.

4. The gate drive circuit according to claim 1, wherein the first layer has a front surface and a back surface; and the signal input terminal of positive side, the signal input terminal of negative side, the signal output terminal of positive side, the signal output terminal of negative side, and the ground terminal are disposed on the front surface of the first layer.

5. The gate drive circuit according to claim 1, wherein the another end of the primary winding is connected to the first ground potential point via the signal input terminal of negative side.

6. The gate drive circuit according to claim 1, wherein the another end of the secondary winding is connected to the second ground potential point via the signal output terminal of negative side and a resistor for impedance matching.

* * * * *